(12) United States Patent
Lee et al.

(10) Patent No.: US 11,806,710 B2
(45) Date of Patent: Nov. 7, 2023

(54) SEMICONDUCTOR PACKAGE STRUCTURES AND METHODS OF MANUFACTURING THE SAME

(71) Applicant: Advanced Semiconductor Engineering, Inc., Kaohsiung (TW)

(72) Inventors: Hsiao-Yen Lee, Kaohsiung (TW); Ying-Te Ou, Kaohsiung (TW); Chin-Cheng Kuo, Kaohsiung (TW); Chung Hao Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 421 days.

(21) Appl. No.: 16/893,150

(22) Filed: Jun. 4, 2020

(65) Prior Publication Data

US 2021/0379590 A1    Dec. 9, 2021

(51) Int. Cl.
*B01L 3/00* (2006.01)
*H01L 23/538* (2006.01)
*H01L 21/02* (2006.01)

(52) U.S. Cl.
CPC ........ *B01L 3/502738* (2013.01); *H01L 21/02* (2013.01); *H01L 23/5386* (2013.01)

(58) Field of Classification Search
None
See application file for complete search history.

(56) References Cited

U.S. PATENT DOCUMENTS

| | | | | |
|---|---|---|---|---|
| 10,464,063 | B2* | 11/2019 | Brown | B01L 3/5027 |
| 2009/0152326 | A1* | 6/2009 | Shin | B81C 3/001 |
| | | | | 228/110.1 |
| 2018/0095052 | A1* | 4/2018 | Jun | H01L 29/41733 |
| 2020/0171495 | A1* | 6/2020 | Jones | A61B 5/1468 |

OTHER PUBLICATIONS

WO 2009/122314 A1, A sensor Chip and Method of Manufacturing the same, Gridelet et al. (Year: 2009).*

* cited by examiner

*Primary Examiner* — Alexander G Ghyka
(74) *Attorney, Agent, or Firm* — FOLEY & LARDNER LLP

(57) ABSTRACT

A semiconductor package structure includes a substrate, a die and a conductive structure. The die is disposed on or within the substrate. The die has a first surface facing away from the substrate and includes a sensing region and a pad at the first surface of the die. The first surface of the die has a first edge and a second edge opposite to the first edge. The sensing region is disposed adjacent to the first edge. The pad is disposed away from the first edge. The conductive structure electrically connects the pad and the substrate. The sensing region has a first end distal to the first edge of the first surface of the die. A distance from the first end of the sensing region to a center of the pad is equal to or greater than a distance from the first end of the sensing region to the first edge of the first surface of the die.

20 Claims, 10 Drawing Sheets

SEMICONDUCTOR PACKAGE STRUCTURES AND METHODS OF MANUFACTURING THE SAME

BACKGROUND

1. Field of the Disclosure

The present disclosure relates to semiconductor package structures and methods of manufacturing the same.

2. Description of Related Art

Semiconductor packages for medical applications generally have a multi-layer structure including a substrate, a biochip, a microfluidic component, and a molded compound. The microfluidic component allows a biological sample to enter a sensing region of the biochip so that the biochip can detect the biological sample and transform the detected signal to an electrical signal. However, the molded compound is liable to react with the biological sample which results in sample contamination and affects the accuracy of the testing results.

SUMMARY

According to some embodiments of the present disclosure, a semiconductor package structure includes a substrate, a die and a conductive structure. The die is disposed on or within the substrate. The die includes a first surface facing away from the substrate. and a sensing region and a pad at the first surface of the die. The first surface of the die has a first edge and a second edge opposite to the first edge. The sensing region is disposed adjacent to the first edge. The pad is disposed away from the first edge. The conductive structure electrically connects the pad and the substrate. The sensing region has a first end distal to the first edge of the first surface of the die. A distance from the first end of the sensing region to a center of the pad is equal to or greater than a distance from the first end of the sensing region to the first edge of the first surface of the die.

According to some embodiments of the present disclosure, a semiconductor package structure includes a substrate, a die, a conductive structure and a protective structure. The die is disposed on or within the substrate. The die includes a first surface facing away from the substrate and a sensing region and a pad at the first surface of the die. The first surface of the die has a first edge and a second edge opposite to the first edge. The sensing region is disposed adjacent to the first edge. The pad is disposed away from the first edge. The conductive structure electrically connects the pad and the substrate. The protective structure covers the pad and the conductive structure. The sensing region has a first end distal to the first edge of the first surface of the die. A distance from the first end of the sensing region to the protective structure is equal to or greater than a distance from the first end of the sensing region to the first edge of the first surface of the die.

According to some embodiments of the present disclosure, a semiconductor package structure includes a substrate and a die disposed on or within the substrate. The die has a first surface facing away from the substrate. The first surface of the die has a first edge and a second edge opposite to the first edge. The die includes, from the first edge to the second edge, a first region for testing a biological sample, a second region for electrically connecting the die to the substrate, and a third region located between the first region and the second region for preventing the biological sample from entering the second region. A length of the third region is equal to or greater than a length of the first region.

According to some embodiments of the present disclosure, a method for manufacturing a semiconductor package structure includes: disposing a die on or within a substrate, wherein the die has a sensing region; electrically connecting the die to the substrate; disposing a microfluidic structure covering the sensing region of the die; and carrying out ultrasonic welding to bond the microfluidic structure to the semiconductor package structure.

BRIEF DESCRIPTION OF THE DRAWINGS

Aspects of the present disclosure are readily understood from the following detailed description when read with the accompanying figures. It should be noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
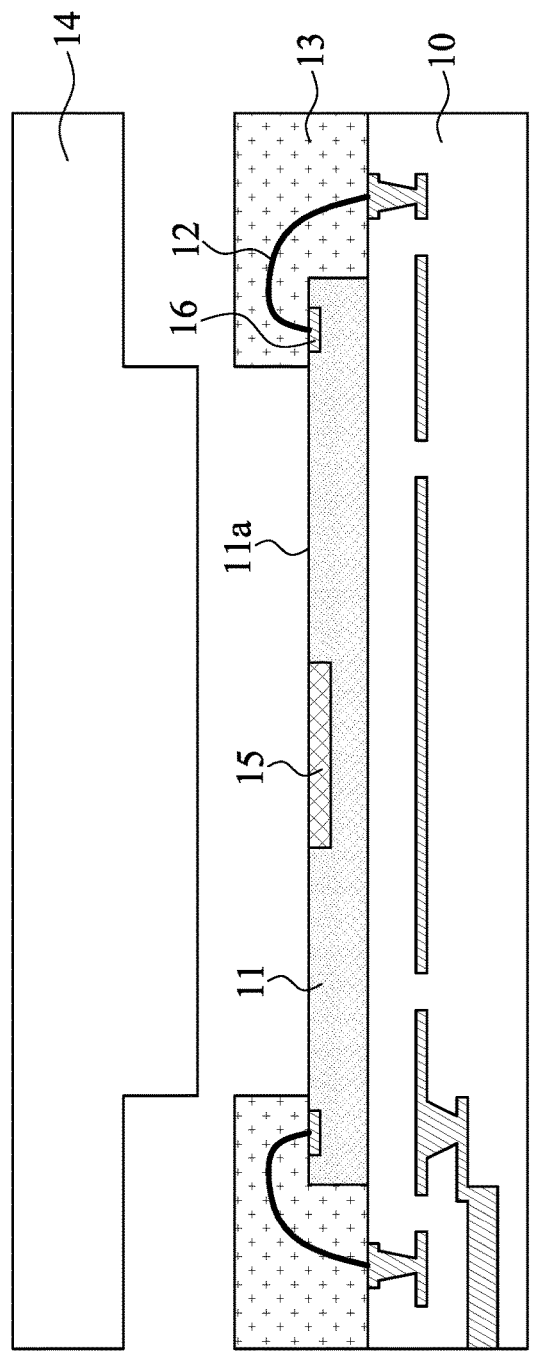
FIG. 1 is a cross-sectional view of a semiconductor package structure in accordance with some comparative embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation or disposal of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a semiconductor package structure 1 in accordance with some embodiments of the present disclosure. The semiconductor package structure 1 includes a substrate 10, a die 11, and a conductive structure 12. The die 11 is disposed on the substrate 10 and has a first surface 11a facing away from the substrate 10. The first surface 11a of the die includes a sensing region 15 and a pad 16. The pad 16 is arranged around the periphery of the first surface 11a of the die 11 and electrically connects to a respective pad (not denoted) of the substrate via a wire 12. A molding compound, such as epoxy resin, is applied to form an encapsulant 13 which covers and protects the pad of the die, the wire, and the pad of the substrate. The encapsulant 13 is arranged around the periphery of semiconductor package structure 1 and defines a recess exposing the sensing region 15 of the die 11. A microfluidic structure 14 is applied onto and contacts the first surface of the die 11. The microfluidic structure 14 has a protruding portion which fits into the recess defined by the encapsulant 13 so that the microfluidic structure 14 can easily couple to the die 11.

The semiconductor package structure 1 can be used for sample analysis. In some embodiments, the sample can include biological samples, such as blood, urine, saliva, plasma or serum. In some embodiments, the sample may include food samples. During sample analysis, at least a portion of the sample passes through the microfluidic structure 14 and enters the sensing region 15 of the die 11 so that the die 11 detects the sample and transforms the detected signal to an electrical signal.

In the embodiments illustrated in FIG. 1, if the sample overflows from the sensing region and reaches the encapsulant formed of a molded compound, the encapsulant may react with the sample, which results in sample contamination and affects the accuracy of the testing results. The present disclosure further provides a semiconductor package structure including a die having a sensing region and pad(s) as illustrated in FIG. 2A, FIG. 2B, FIG. 3, FIG. 4, FIG. 5A, FIG. 5B, FIG. 6, FIG. 7 and FIG. 8. The distance from the sensing region to the die pad (or to the molded compound which covers the die pad) is adjusted to a certain range so that the overflow of the sample, if present, would not reach the die pad or the molded compound. Furthermore, the pad(s) are arranged only around one edge of the die (i.e., there are no pads arranged around the opposing edge of the die or even around the other edges of the die), and therefore, the use of the molded compound can be reduced and the sensing region can be arranged close to the opposing edge as possible which reduces not only the manufacturing cost but also the possibility of sample contamination.

Figure 2A:
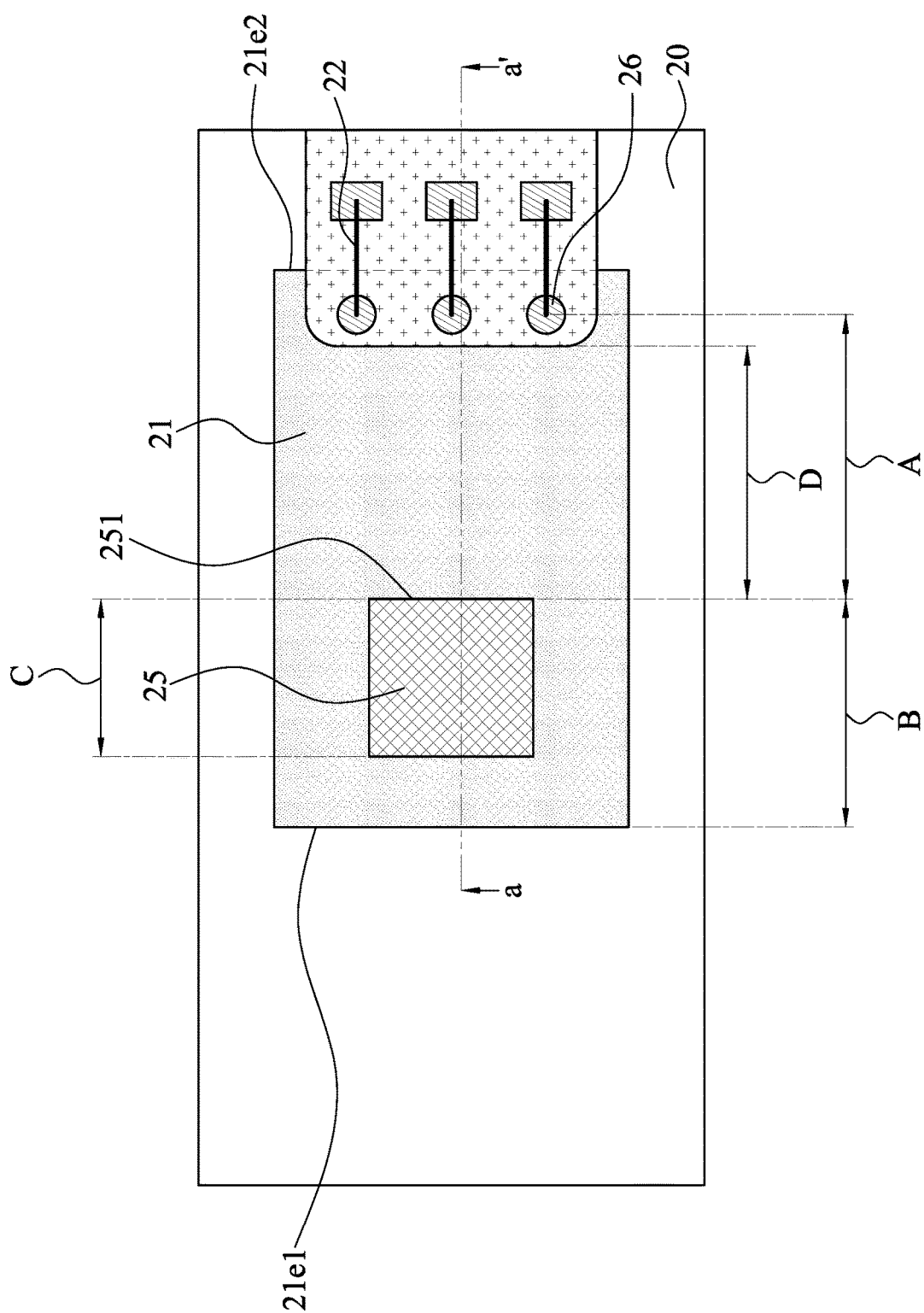
FIG. 2A is a top view of a semiconductor package structure in accordance with some embodiments of the present disclosure.
Figure 2B:
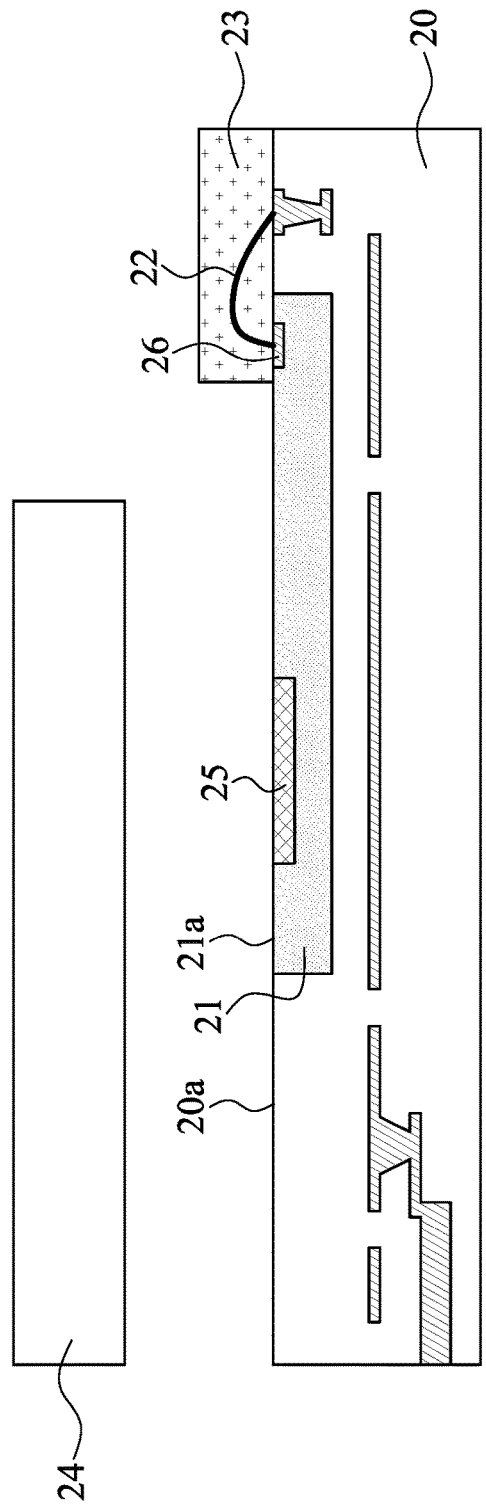
FIG. 2B is a cross-sectional view along line a-a' of the semiconductor package structure of FIG. 2A.

FIG. 2A and FIG. 2B illustrate a semiconductor package structure 2 in accordance with some embodiments of the present disclosure. FIG. 2A is a top view of the semiconductor package structure 2. FIG. 2B is a cross-sectional view along line a-a' of the semiconductor package structure 2 of FIG. 2A. As shown in FIG. 2A and FIG. 2B, the semiconductor package structure 2 includes a substrate 20, a die 21, and a conductive structure 22.

The die 21 has a first surface 21a facing away from the substrate and includes a sensing region 25 and a pad 26 at the first surface 21a. The first surface 21a has a first edge 21e1 and a second edge 21e2 opposite thereto. The sensing region 25 is disposed adjacent to the first edge 21e1, and the pad 26 is disposed away from the first edge 21e1. In some embodiments, the pad 26 may be disposed adjacent to the second edge 21e2. The sensing region 25 of the die 21 has a first end 251 distal to the first edge 21e1 of the first surface 21a of the die. In some embodiments, the first surface 21a of the die is in the form of a quadrilateral, e.g., a rectangle or square.

The sensing region 25 has a length C (i.e., the largest dimension of the sensing region 25 on the first surface). The sensing region 25 may be in the form of a circle, a rectangle or any other suitable shape.

In some embodiments, a distance A from the first end 251 of the sensing region 25 to a center of the pad 26 is equal to or greater than a distance B from the first end 251 of the sensing region 25 to the first edge 21e1 of the first surface 21a of the die. In some embodiments, the distance A is equal to or greater than the length C of the sensing region 25. In some embodiments, the distance A is equal to or greater than 1.1 times the length C of the sensing region 25 (i.e., A≥1.1×C). In some embodiments, the distance A is equal to or greater than 1.2 times, 1.3 times, 1.4 times, or 1.5 times the length C of the sensing region 25. In some embodiments, the distance A refers to the shortest distance from the first end 251 of the sensing region 25 to a center of the pad 26 and the distance B refers to the shortest distance from the first end 251 of the sensing region 25 to the first edge 21e1 of the first surface 21a of the die. Since the distance from the sensing region to the die pad (i.e., the distance A) is adjusted to a certain range, the overflow of the sample, if present, would not reach the die pad or the molded compound covering the die pad, and thus reduces the possibility of sample contamination.

The substrate 20 may include traces, pads, or interconnections for electrical connection. The substrate 20 includes a first surface 20a and one or more pads at the first surface 20a. The pad 26 of the die 21 is electrically connected to a respective pad (not denoted) of the substrate 20 via the conductive structure 22. The conductive structure 22 may be a wire or metal pin.

In the embodiments illustrated in FIG. 2B, the substrate 20 has a cavity for accommodating the die 21. The die 21 is disposed or embedded within the substrate 20 and the first surface 21a of the die 21 is exposed from a first surface 20a of the substrate 20. In some embodiments, the first surface 21a of the die 21 is substantially coplanar with the first surface 20a of the substrate 20. In some embodiments, the sensing region 25 of the die 21 is substantially coplanar with the first surface 20a of the substrate 20. Since the first surface 21a of the die 21 (or the sensing region 25 of the die 21) is substantially coplanar with the first surface 20a of the substrate 20 and thus forms a flat surface, it is easier to place a microfluidic structure 24 thereon as compared to the embodiments in accordance with the semiconductor package structure 1 of FIG. 1. In some embodiments, the microfluidic structure may be bonded to the semiconductor package structure via ultrasonic welding which provides superior bonding between the microfluidic structure and the semiconductor package structure as compared to the embodiments in accordance with the semiconductor package structure 1 of FIG. 1.

The semiconductor package structure 2 may further include a protective structure 23 covering the pad 26 of the die 21 and the conductive structure 22. The protective structure 23 also covers the pad of the substrate which is electrically connected to the pad 26 of the die 21 via the conductive structure 22. In some embodiments illustrated in FIG. 2B, the protective structure 23 may be an encapsulant 23. The encapsulant may include a molded compound.

In some embodiments, a distance D from the first end 251 of the sensing region 25 to the protective structure 23 is equal to or greater than a distance B from the first end 251 of the sensing region to the first edge of the first surface of the die. In some embodiments, the distance D is equal to or greater than the length C of the sensing region 25. In some embodiments, the distance D is equal to or greater than 1.1 times the length C of the sensing region 25 (i.e., D≥1.1×C). In some embodiments, the distance A is equal to or greater than 1.2 times, 1.3 times, 1.4 times, or 1.5 times the length C of the sensing region 25. In some embodiments, the distance D refers to the shortest distance from the first end 251 of the sensing region 25 to the protective structure 23 and the distance B refers to the shortest distance from the first end 251 of the sensing region 25 to the first edge 21e1 of the first surface 21a of the die. Since the distance from the sensing region to the protective structure (i.e., the distance D) is adjusted to a certain range, the overflow of the sample, if present, would not reach the protective structure, and thus reduces the possibility of sample contamination.

In some embodiments, a periphery of the pad 26 contacts a periphery of the protective structure 23 so that the distance D may also refer to the distance from the first end 251 of the sensing region 25 to the periphery of the pad 26 (or an outer edge of the pad).

The semiconductor package structure 2 may further include a microfluidic structure 24 disposed on and in contact with the sensing region 25 of the die 21. The microfluidic structure 24 may include microconduit(s) or microchannel(s) and direct the sample to the sensing region of the die. The microfluidic structure may be made of polydimethylsiloxane (PDMS), polymethyl methacrylate (PMMA), a polymer or copolymer of cycloolefin (COC), polystyrene (PS) or other suitable materials. In some embodiments, the microfluidic structure is made of PDMS or PMMA.

Figure 3:
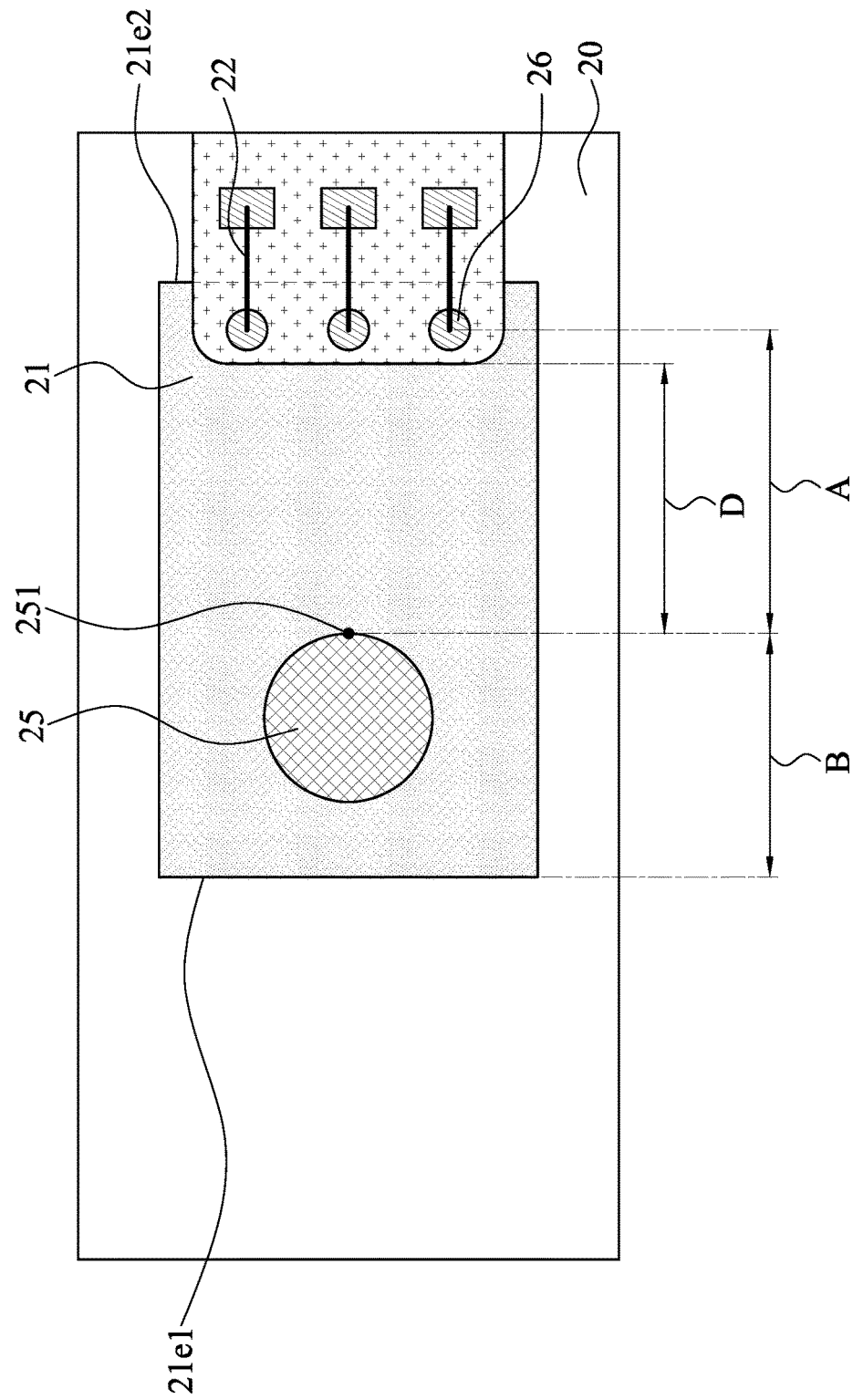
FIG. 3 is a top view of a semiconductor package structure in accordance with some embodiments of the present disclosure.

FIG. 3 is a top view of a semiconductor package structure 3 in accordance with some embodiments of the present disclosure. The semiconductor package structure 3 shown in FIG. 3 has a similar structure to the semiconductor package structure 2 except that the sensing region 25 of the die 21 of the semiconductor package structure 3 is in the form of a circle.

Figure 4:
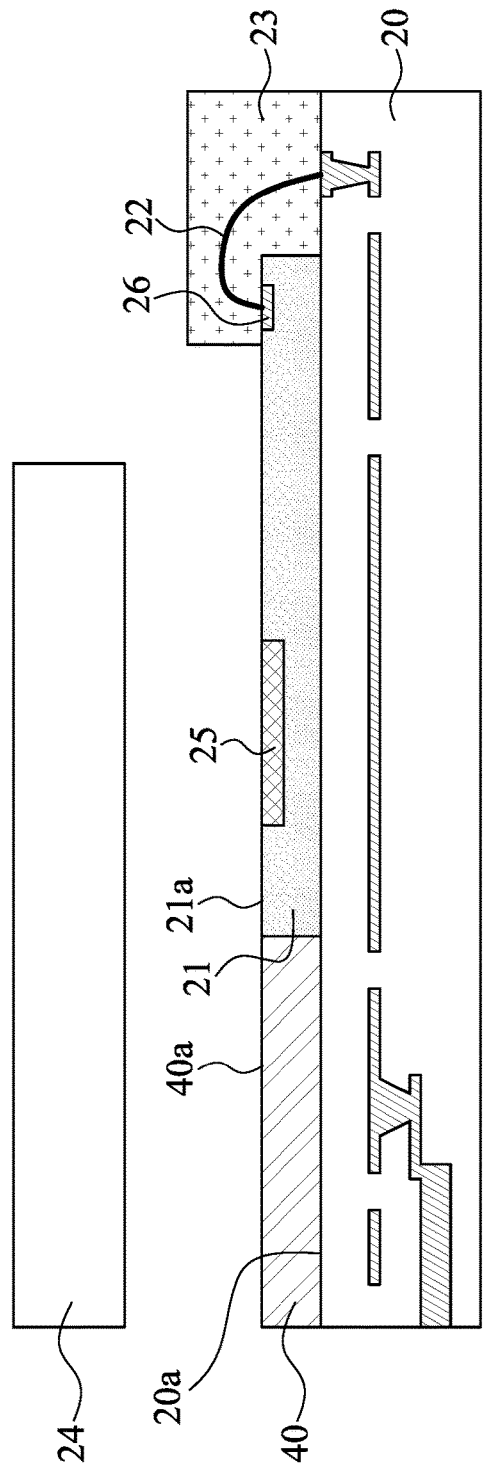
FIG. 4 is a cross-sectional view of a semiconductor package structure in accordance with some embodiments of the present disclosure.

FIG. 4 is a cross-sectional view of a semiconductor package structure 4 in accordance with some embodiments of the present disclosure. The semiconductor package structure 4 shown in FIG. 4 has a similar structure to the semiconductor package structure 2 except that the die 21 is disposed on the substrate 20 and the semiconductor package structure 4 includes a dummy component 40.

As shown in FIG. 4, the die 21 is disposed on a first surface 20a of the substrate 20 and the dummy component 40 is disposed on the first surface 20a of the substrate 20. The dummy component 40 has a first surface 40a facing away from the substrate 20 and the first surface 40a of the dummy component 40 is substantially coplanar with the first surface 21a of the die 21. In some embodiments, the first surface 40a of the dummy component 40 is substantially coplanar with the sensing region 25 of the die 21. Since the first surface 21a of the die 21 (or the sensing region 25 of the die 21) is substantially coplanar with the first surface 40a of the dummy component 40 such that a flat surface is formed, it is easier to place a microfluidic structure 24 thereon as compared to the embodiments in accordance with the semiconductor package structure 1 of FIG. 1. In addition, since the die 21 is disposed on a first surface 20a of the substrate 20, it is unnecessary to form a cavity within the substrate 20 for accommodating the die 21 and thus the manufacturing process can be simplified and the cost may be reduced.

In some embodiments, the dummy component 40 is a dummy wafer or is made of glass or polymer. In some embodiments, the dummy component is made of polymer and the polymer includes PDMS or PMMA.

Figure 5A:
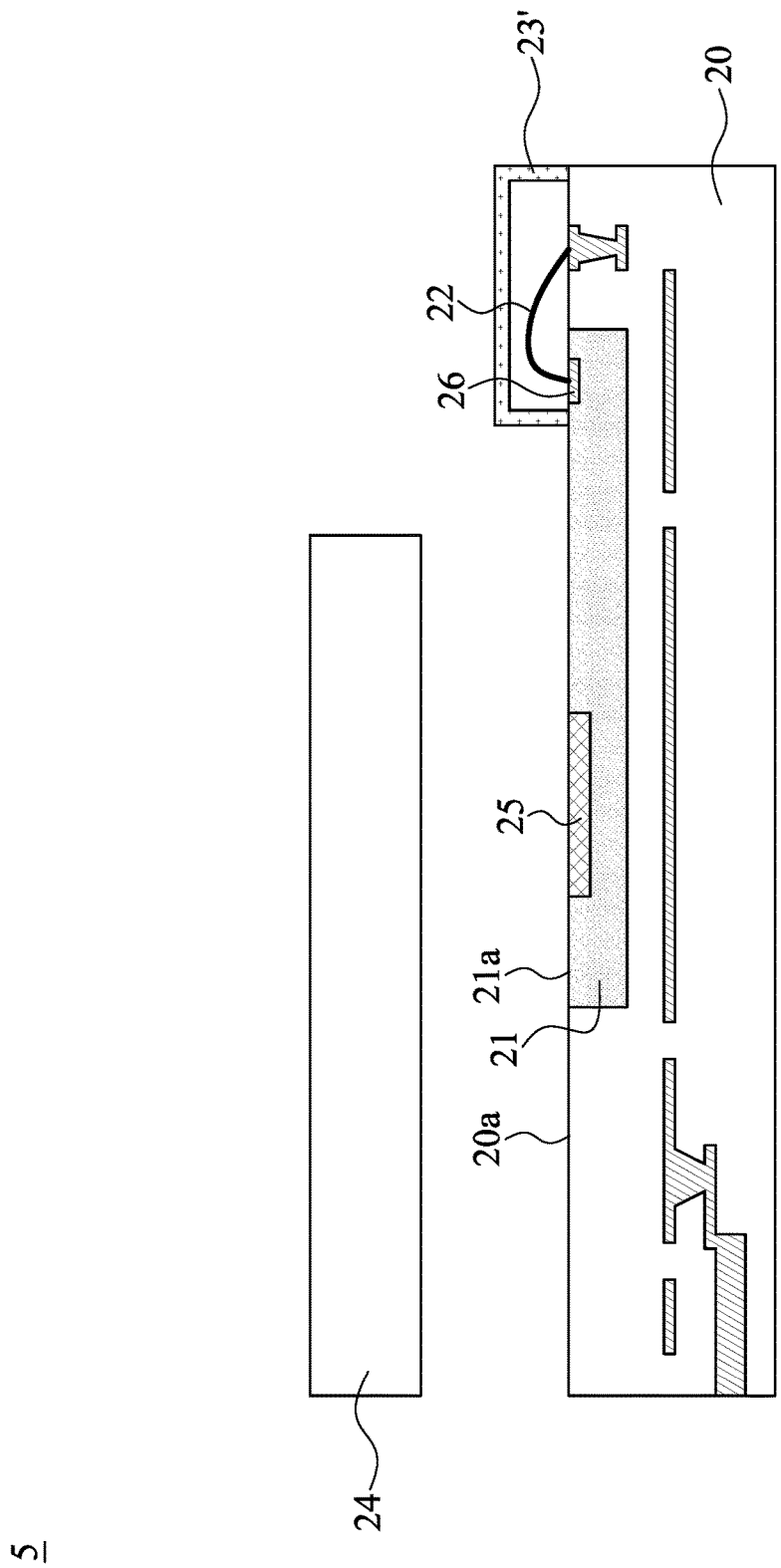
FIG. 5A is a cross-sectional view of a semiconductor package structure in accordance with some embodiments of the present disclosure.
Figure 5B:
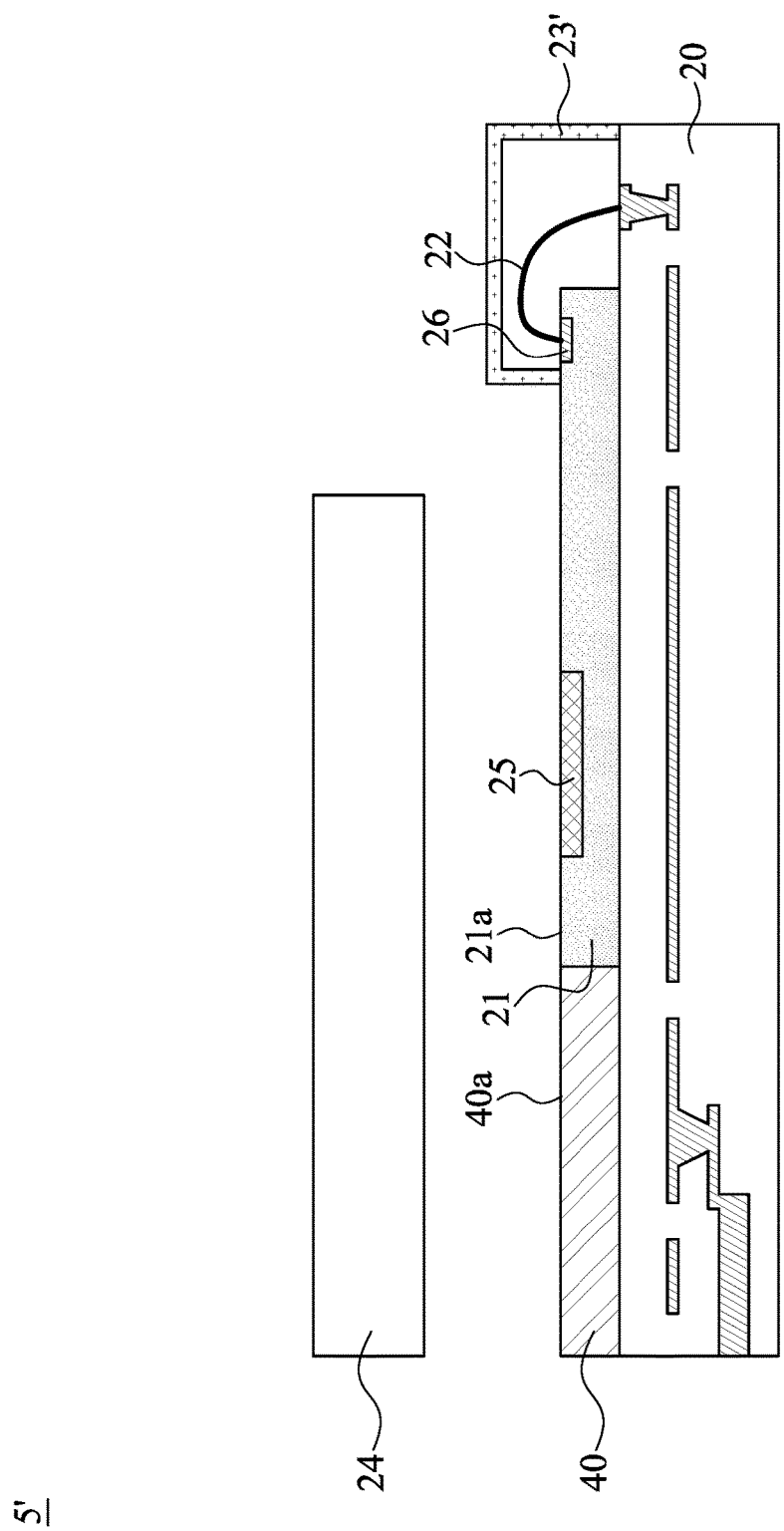
FIG. 5B is a cross-sectional view of a semiconductor package structure in accordance with some embodiments of the present disclosure.

FIG. 5A is a cross-sectional view of a semiconductor package structure 5 in accordance with some embodiments of the present disclosure. The semiconductor package structure 5 shown in FIG. 5A has a similar structure to the semiconductor package structure 2. FIG. 5B is a cross-sectional view of a semiconductor package structure 5' in accordance with some embodiments of the present disclosure. The semiconductor package structure 5' shown in FIG. 5B has a similar structure to the semiconductor package structure 4. In the semiconductor package structure 5 and the semiconductor package structure 5' a cap 23' is used as a protective structure and covers the pad 26 of the die 21 and the conductive structure 22. The cap 23' may be made of metal, plastic or other suitable materials.

Figure 6:
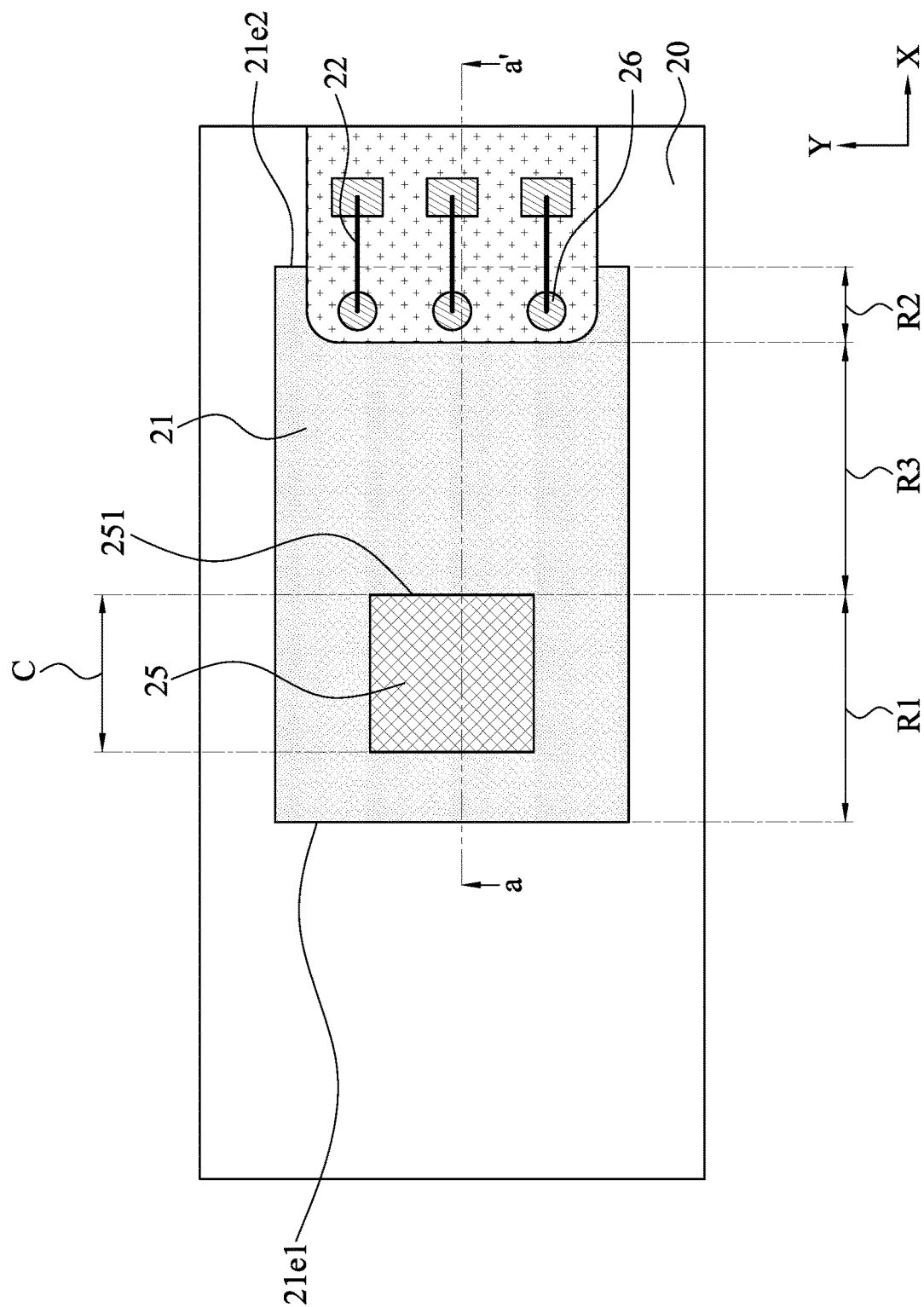
FIG. 6 is a top view of a semiconductor package structure in accordance with some embodiments of the present disclosure.

FIG. 6 is a cross-sectional view of a semiconductor package structure 6 in accordance with some embodiments of the present disclosure. The semiconductor package structure 6 includes a substrate 20 and a die 21. The die 21 may be disposed on or within the substrate 20 and includes a first surface 21a facing away from the substrate 20 as illustrated in FIG. 2B, FIG. 4, FIG. 5A, and FIG. 5B. The first surface 21a of the die 21 has a first edge 21e1 and a second edge 21e2 opposite to the first edge 21e1.

The die 21 includes, from the first edge 21e1 to the second edge 21e2, a first region R1 for testing a sample, a second region R2 for electrically connecting the die 21 to the substrate 20, and a third region R3 located between the first region R1 and the second region R2 for preventing the sample from entering the second region R2.

The first region R1 of the die 21 includes a function area 25. The function area 25 detects the sample and transforms the detected signal to an electrical signal. In some embodiments, the function area 25 of the first region R1 is adjacent to the third region R3 of the die 21 and has a distal end 251 abutting the third region R3 of the die 21. In some embodiments, the first region R1 may further include a non-function area located around a periphery of the first region R1 and surrounding the function area 25.

The second region R2 of the die 21 may include one or more pads for electrical connection. The pads of the second region R2 are electrically connected to respective pads of the substrate 20. The semiconductor package structure 6 further includes a protective structure 23 (e.g., an encapsulant or a cap) covering the one or more pads 26 of the second region. The protective structure 23 may also cover the pads of the substrate 20 which are electrically connected to the pads 26 of the die 21 via conductive structures 22.

The third region R3 of the die 21 is located between the first region R1 and the second region R2 and can effectively prevents the sample from entering the second region R2. In some embodiments, the third region R3 has a length equal to or greater than a length of the first region R1. In some embodiments, the length of the third region R3 is equal to or greater than a length C of the function area 25 of the first region R1. In some embodiments, the length of the third region R3 is equal to or greater than 1.1 times the length C of the function area 25 of the first region R1. In some embodiments, the length of the third region R3 is equal to or greater than 1.2 times, 1.3 times or 1.4 times or 1.5 times the length C of the function area 25 of the first region R1. As shown in FIG. 6, the first region R1, the third region R3 and the second region R2 are arranged sequentially along the x-axis and the length of the first region R1, the third region R3, the second region R2 and the function area 25 refers to a largest dimension thereof along the x-axis. Since the length of the third region R3 is adjusted to a certain range so that the overflow of the sample, if present, would not reach the die pad disposed in the second region R2.

The semiconductor package structure 6 may further include a microfluidic structure 24 disposed on the first region R1 of the die 21. In some embodiments, the microfluidic structure may be bonded to the semiconductor package structure via ultrasonic welding. The microfluidic structure 24 may include microconduit(s) or microchannel(s) and direct the sample to the first region R1 of the die 21 (e.g., the function area 25 of the first region R1 of the die) for testing. The microfluidic structure may be made of polydimethylsiloxane (PDMS), polymethyl methacrylate (PMMA), a polymer or copolymer of cycloolefin (COC), polystyrene (PS) or other suitable materials as discussed hereinbefore.

Figure 7:
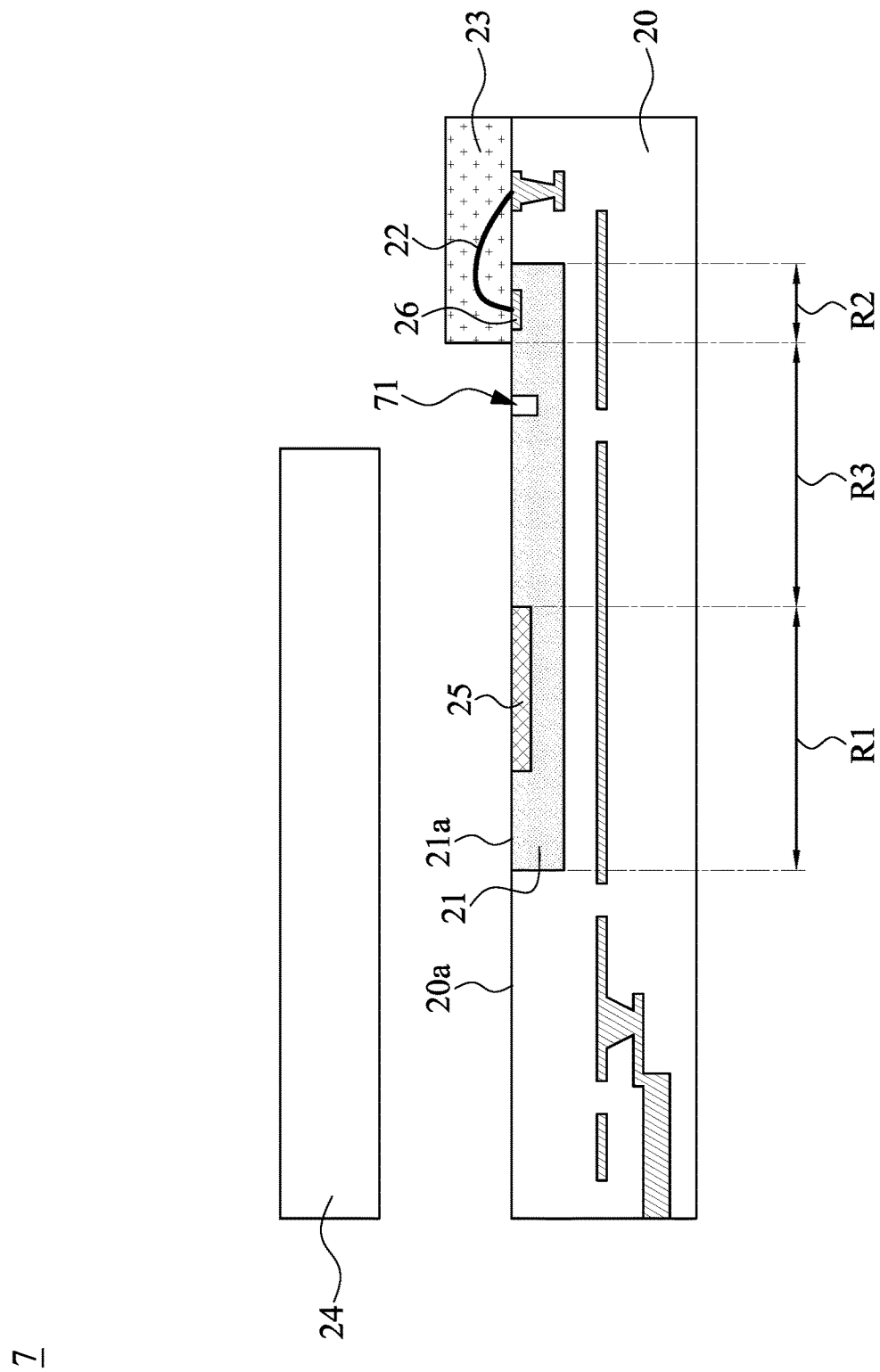
FIG. 7 is a cross-sectional view of a semiconductor package structure in accordance with some embodiments of the present disclosure.

FIG. 7 is a cross-sectional view of a semiconductor package structure 7 in accordance with some embodiments of the present disclosure. The semiconductor package structure 7 shown in FIG. 7 has a similar structure to the semiconductor package structure 2 or the semiconductor package structure 6. As illustrated in FIG. 7, the third region R3 may further include a groove 71. The groove 71 may be formed by laser cutting or sawing. The groove 71 can accommodate an overflow of the sample, and thus can further prevent the sample from entering the second region R2.

Figure 8:
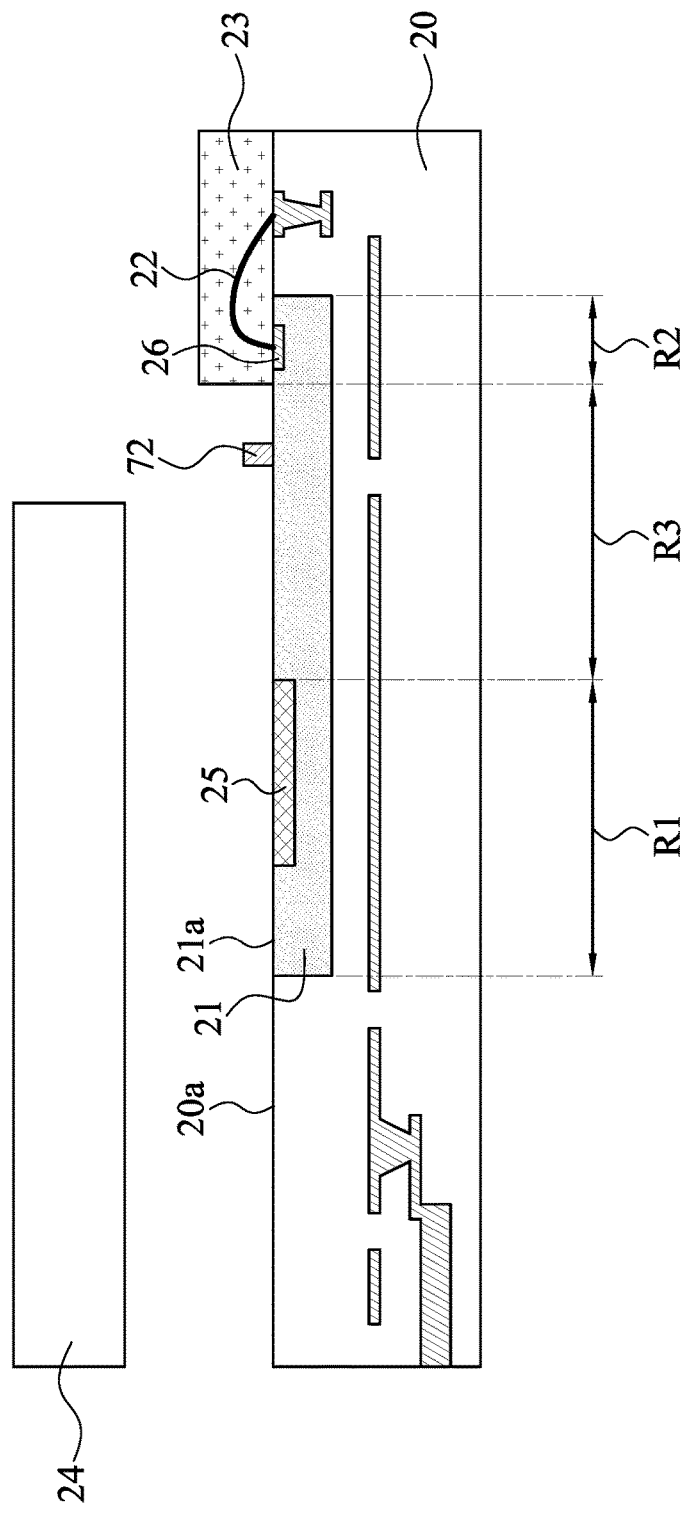
FIG. 8 is a cross-sectional view of a semiconductor package structure in accordance with some embodiments of the present disclosure.

FIG. 8 is a cross-sectional view of a semiconductor package structure 7 in accordance with some embodiments of the present disclosure. The semiconductor package structure 7 shown in FIG. 8 has a similar structure to the semiconductor package structure 2 or the semiconductor package structure 6. As illustrated in FIG. 8, the third region R3 may further include a baffle 72 which further prevents the sample from entering the second region R2.

In some embodiments, the third region R3 may include a solvophobic coating such that the sample would not enter the third region R3. The solvophobic coating can be made of any suitable material in view of the composition of the sample.

The present disclosure provides a method for manufacturing a semiconductor package structure, which includes the following steps: disposing a die on or within a substrate, electrically connecting the die to the substrate; disposing a microfluidic structure covering a sensing region of the die; and carrying out ultrasonic welding to bond the microfluidic structure to the semiconductor package structure. The semiconductor package structure may have a structure as discussed hereinbefore.

In some embodiments, the step of electrically connecting the die to the substrate includes electrically connecting a pad of the die to a respective pad of the substrate by a conductive structure (e.g., a wire or metal pin). some embodiments, the method further includes a step of disposing a protective structure (e.g., an encapsulant or a cap) covering the pad of the die, the respective pad of the substrate and the conductive structure.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, spatially relative terms, such as "above," "below," "up," "left," "right," "down," "top," "bottom," "vertical," "horizontal," "side," "higher," "lower," "upper," "over," "under" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 μm, or no greater than 0.5 μm. A surface can be deemed to be substantially flat if a displacement between the highest point and the lowest point of the surface is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a substrate;
   a die disposed over or within the substrate; and
   a microfluidic structure disposed only partially over the die,
   wherein the die has a first surface facing away from the substrate, and the first surface of the die has a first lateral edge and a second lateral edge opposite to the first lateral edge,
   wherein the die comprises, from the first lateral edge to the second lateral edge, a first non-sensing region, a sensing region for testing a biological sample, a second non-sensing region, and an electrical connection region for electrically connecting the die to the substrate, and
   wherein the microfluidic structure is configured to direct the biological sample to the sensing region of the die, wherein a distance between a first lateral edge of the sensing region and the first lateral edge of the die is less than a distance between a second lateral edge of the sensing region and the second lateral edge of the die.

2. A semiconductor package structure, comprising:
   a substrate;
   a die disposed over or within the substrate, wherein the die has a first surface facing away from the substrate, wherein the die has a first surface facing away from the substrate, and the first surface of the die has a first lateral edge and a second lateral edge opposite to the first lateral edge, wherein the die comprises, from the first lateral edge to the second lateral edge, a first non-sensing region, a sensing region for testing a biological sample, a second non-sensing region, and an electrical connection region for electrically connecting the die to the substrate;
   a microfluidic structure disposed over only a portion of the second non-sensing region of the die; and
   an encapsulant in contact with the electrical connection region and the substrate,
   wherein a distance between a right edge of the sensing region and the encapsulant is greater than a distance between a left edge of the sensing region and the first lateral edge of the die.

3. The semiconductor package structure of claim 1, wherein the second non-sensing region is configured to prevent the biological sample from entering the electrical connection region.

4. The semiconductor package structure of claim 3, further comprising
   an encapsulant in contact with the electrical connection region and the substrate; and
   a baffle protruding from the second non-sensing region, wherein the baffle is spaced apart from the microfluidic structure and apart from the encapsulant.

5. The semiconductor package structure of claim 4, wherein the baffle is configured to prevent the microfluidic structure 24 from contacting the encapsulant.

6. The semiconductor package structure of claim 4, wherein a distance between a right end of the microfluidic structure and the encapsulant is greater than a distance between the right end of the microfluidic structure and the baffle.

7. The semiconductor package structure of claim 3, wherein the baffle and the microfluidic structure are vertically non-overlapped.

8. The semiconductor package structure of claim 1, further comprising an encapsulant in contact with the electrical connection region and the substrate, wherein the encapsulant is spaced apart from the sensing region of the die.

9. The semiconductor package structure of claim 1, wherein the first non-sensing region of the die is free from any direct electrical connection to the substrate.

10. The semiconductor package structure of claim 1, wherein a lateral surface of the microfluidic structure is substantially aligned with a lateral surface of the substrate.

11. The semiconductor package structure of claim 1, wherein a horizontal distance between a left end of the microfluidic structure and the first lateral edge of the die is different from a horizontal distance between a right end of the microfluidic structure and the second lateral edge of the die.

12. The semiconductor package structure of claim 2, wherein the microfluidic structure directly contacts the substrate.

13. The semiconductor package structure of claim 2, wherein the microfluidic structure covers an interface between the sensing region and the first non-sensing region.

14. The semiconductor package structure of claim 2, wherein the encapsulant is spaced apart from the microfluidic structure.

15. The semiconductor package structure of claim 2, further comprising a dummy component in contact with the substrate.

16. The semiconductor package structure of claim 15, wherein a top surface of the dummy component is substantially coplanar with the first surface of the die.

17. The semiconductor package structure of claim 15, wherein a distance between the dummy component and the sensing region is less than a distance between the dummy component and the second non-sensing region.

18. The semiconductor package structure of claim 15, wherein the dummy component contacts a lateral surface of the die.

19. The semiconductor package structure of claim 2, wherein the encapsulant comprises a first portion contacting the die and a second portion disposing over the substrate, wherein a thickness of the first portion is less than a thickness of the second portion.

20. The semiconductor package structure of claim 2, wherein a width of the encapsulant is less than a width of the die in a top view.

* * * * *